(12) United States Patent
Zambrano et al.

(10) Patent No.: US 7,049,646 B2
(45) Date of Patent: May 23, 2006

(54) CAPACITOR FOR SEMICONDUCTOR INTEGRATED DEVICES

(75) Inventors: Raffaele Zambrano, Viagrande (IT); Cesare Artoni, Augusta (IT)

(73) Assignee: STMicroelectronics, S.R.L., Agrate Brianza (MI) (IT)

( * ) Notice: Subject to any disclaimer, the term of this patent is extended or adjusted under 35 U.S.C. 154(b) by 0 days.

(21) Appl. No.: 10/327,704

(22) Filed: Dec. 20, 2002

(65) Prior Publication Data
US 2003/0146460 A1 Aug. 7, 2003

(30) Foreign Application Priority Data
Dec. 28, 2001 (EP) .................................. 01830821

(51) Int. Cl.
*H01L 29/76* (2006.01)
(52) U.S. Cl. ...................... 257/295; 257/296; 257/300; 257/303; 257/306
(58) Field of Classification Search ................ 257/295, 257/296, 297, 298, 300, 303, 304, 306, 310
See application file for complete search history.

(56) References Cited

U.S. PATENT DOCUMENTS

| | | | |
|---|---|---|---|
| 5,137,842 A | | 8/1992 | Chan et al. |
| 5,605,858 A | | 2/1997 | Nishioka et al. |
| 5,998,825 A | * | 12/1999 | Ochiai .................... 257/311 |
| 6,020,233 A | * | 2/2000 | Kim ........................ 438/240 |
| 6,246,082 B1 | * | 6/2001 | Mitarai et al. ............ 257/295 |
| 6,281,535 B1 | * | 8/2001 | Ma et al. .................. 257/295 |
| 6,388,285 B1 | * | 5/2002 | Black et al. .............. 257/315 |
| 6,538,272 B1 | * | 3/2003 | Yamazaki et al. ......... 257/295 |
| 2004/0129961 A1 | * | 7/2004 | Paz de Araujo et al. ... 257/295 |

FOREIGN PATENT DOCUMENTS

| | | |
|---|---|---|
| WO | WO 96/10845 | 4/1996 |
| WO | WO 99/28972 | 6/1999 |

OTHER PUBLICATIONS

Robert E. Jones, Jr., "Integration of Ferroelectric Nonvolatile Memories", Process Integration, Solid State Technology, Oct. 1997, pp. 201-208.

* cited by examiner

*Primary Examiner*—Minhloan Tran
*Assistant Examiner*—Tan Tran
(74) *Attorney, Agent, or Firm*—Lisa K. Jorgenson; Bryan A. Santarelli; Graybeal Jackson Haley LLP

(57) ABSTRACT

A memory cell of a stacked type is formed by a MOS transistor and a ferroelectric capacitor. The MOS transistor is formed in an active region of a substrate of semiconductor material and comprises a conductive region. The ferroelectric capacitor is formed on top of the active region and comprises a first and a second electrodes separated by a ferroelectric region. A contact region connects the conductive region of the MOS transistor to the first electrode of the ferroelectric capacitor. The ferroelectric capacitor has a non-planar structure, formed by a horizontal portion and two side portions extending transversely to, and in direct electrical contact with, the horizontal portion.

35 Claims, 2 Drawing Sheets

CAPACITOR FOR SEMICONDUCTOR INTEGRATED DEVICES

This application claims priority from European patent application No. 01830821.3, filed Dec. 28, 2001, which is incorporated herein by reference.

TECHNICAL FIELD

The present invention relates generally to a ferroelectric capacitor for semiconductor integrated devices and to the fabrication process thereof.

More specifically, the invention relates to a capacitor for a ferroelectric memory device integrated in a semiconductor substrate and of the type comprising a control circuitry and an array of ferroelectric memory cells.

BACKGROUND

As is known and shown in FIG. 1, a ferroelectric cell 1 is formed by a MOS transistor 2 and a capacitor 3 which has, as dielectric, a ferroelectric material, for example PZT ($PbZr_{1-x}Ti_xO_3$), SBT ($SrBi_2Ta_2O_9$) or BLT ($Bi_{4-x}La_xTi_3O_{12}$) or a paraelectric material, for example BST ($BaSr_{1-x}Ti_xO_3$). More in particular, in the ferroelectric cell 1, the MOS transistor 2 is an N-channel transistor and has a drain terminal 4 connected to the bit line BL, a gate electrode 5 connected to a word line WL, and a source terminal 6 connected to a first electrode 7 of the capacitor 3. A second electrode 8 of the capacitor 3 is connected to a plate line PL.

The cell can store binary information by virtue of the hysteresis characteristics of the ferroelectric material comprised between the electrodes 7 and 8 and assuming, when no voltage is applied, two biasing states, according to the voltage previously applied to the electrodes of the capacitor 3.

The ferroelectric cells currently known may be in a strapped or in a stacked configuration. In the cells with strapped configuration, an example of which is shown in FIG. 2, the capacitor 3 is made on top of a field oxide region 10 delimiting an active area 11 of a substrate 12 which houses conductive regions—source region 14 and drain region 13—of the MOS transistor 2. In greater detail, the first electrode 7 of the capacitor 3 is arranged at the top and comprises a conductive region (for example of platinum) having a square or rectangular shape, connected to the drain region 13 of the MOS transistor 2 through a metal connection 16. The second electrode 8 of the capacitor 3 is arranged at the bottom and comprises a layer of conductive material (for example, platinum) which extends perpendicular to the sheet plane and forms a plate line PL, connected to the other capacitors of the adjacent cells. A dielectric region 17, of ferroelectric material, is comprised between the first electrode 7 and the second electrode 8. The gate electrode 5 of the MOS transistor 2 is of a polycrystalline silicon layer 18, which extends perpendicular to the sheet plane and forms a word line WL.

In the cells with stacked configuration, an example whereof is shown in FIG. 3, the capacitor 3 is formed on top of the active area 11, directly above the source region 14 of the transistor 2. In this case, the first electrode 7 of the capacitor 3 is arranged at the bottom and comprises a conductive region (for example, of platinum) having a square or rectangular shape, connected to the source region 14 through a contact 23 formed in an opening of a protective layer 24 (for example of BPSG), and the second electrode 8, of conductive material, is arranged at the top and is connected to the metal layer 25, thus defining the plate line PL.

Materials having barrier properties against oxygen (such as Ir/$IrO_2$) 26 extend underneath the first electrode 7 and delimit at the top of the contact 23.

FIG. 4 shows the architecture of an array 28 of ferroelectric cells in the open bit line configuration. As may be seen, the ferroelectric cells 1 are arranged in rows and columns and are connected so that pairs of cells 27 are arranged parallel to the bit lines BL; the MOS transistors 2 of each pair of cells 27 have common drain regions, which are connected to the same bit line BL; and the capacitors 3 that belong to one pair of cells 27 adjacent in a direction parallel to the bit lines BL are connected to two adjacent plate lines PL.

The ferroelectric cells in stacked configuration are preferred since they satisfy the size scaling requirement of new CMOS technologies.

Various examples of cells in stacked configuration are disclosed in which both the electrodes 7, 8 and the dielectric region 17 are defined using a single mask and forming the plate line PL with a special metal layer. In another embodiment, the bottom electrode 7 comprises a conductive region formed separately, while the dielectric region 17 and the top electrode 8 are mutually aligned and formed with a single mask.

In all the above cases, etching at least one of the electrodes 7 and 8 with the same mask used for etching the ferroelectric material that constitutes the dielectric region 17 is critical. For example, during etching, compounds are formed that may redeposit along the edge of the capacitor and short circuit it. On the other hand, separate definition of the three parts forming the capacitor 3 (the two electrodes 7 and 8 and the dielectric region 17), which should solve the problem due to the fabrication processes, leads to an increase in the overall dimensions, thus going against the current trend of size scaling. In fact, when making the definition mask, it is necessary to take into account both the alignment tolerances and the minimum distances between the bottom electrode and the top electrode (for example, a distance of 0.4 µm). In particular, the bottom electrode 7 must be, on every side, larger than the dielectric region 17 by an amount at least equal to the alignment tolerance (for example, at least 0.2 µm). Likewise, the dielectric region 17 must be larger than the top electrode 8 by the same amount. Consequently, taking into account the minimum distance between the bottom electrodes 7, the overall dimensions of the capacitor 3, and consequently of the ferroelectric cells 1, are excessive.

In U.S. Pat. No. 6,300,654 granted to the present applicant, the above disadvantages are eliminated in a memory cell in stacked configuration. In practice, the distance between the dielectric regions of at least two ferroelectric memory cells adjacent in the direction of the bit lines is reduced. In particular, the dielectric region 17 is continuous and is shared between the two adjacent capacitors that belong to a pair of adjacent cells. In this way, the layout rules for scaling the capacitor are dictated only by the distance between two adjacent bottom electrodes and by the lateral space between the top and the bottom electrodes. This enables, for a same cell area, maximization of the working area of the capacitor as compared to the layout of the solution using three masks for defining the capacitor, wherein the dielectric region of cells that are adjacent in the direction of the bit lines is separated. Furthermore, the solution described in the above mentioned US patent causes an increase in the amplitude of the signal (proportional to the active area of the capacitor) supplied by each cell to the sense amplifier during reading.

The above known solution moreover affords the following advantages:

1) the ratio between the area of the capacitor and the total area of the cell is maximized; and
2) the critical points in the photolithography step and in the connections of the ferroelectric material are removed.

The current trend is in the direction of further size scaling of the devices.

SUMMARY

An embodiment of the present invention provides a process that is in line with the above trend, and thus manufactures a ferroelectric capacitor for a semiconductor device, which has even smaller dimensions and even greater capacitance. More specifically, a stacked type ferroelectric memory cell and the fabrication process thereof are discussed.

BRIEF DESCRIPTION OF THE DRAWINGS

For a better understanding of the present invention, a preferred embodiment thereof is now described, purely by way of non-limiting example, with reference to the attached drawings, wherein.

DETAILED DESCRIPTION

Figure 5:
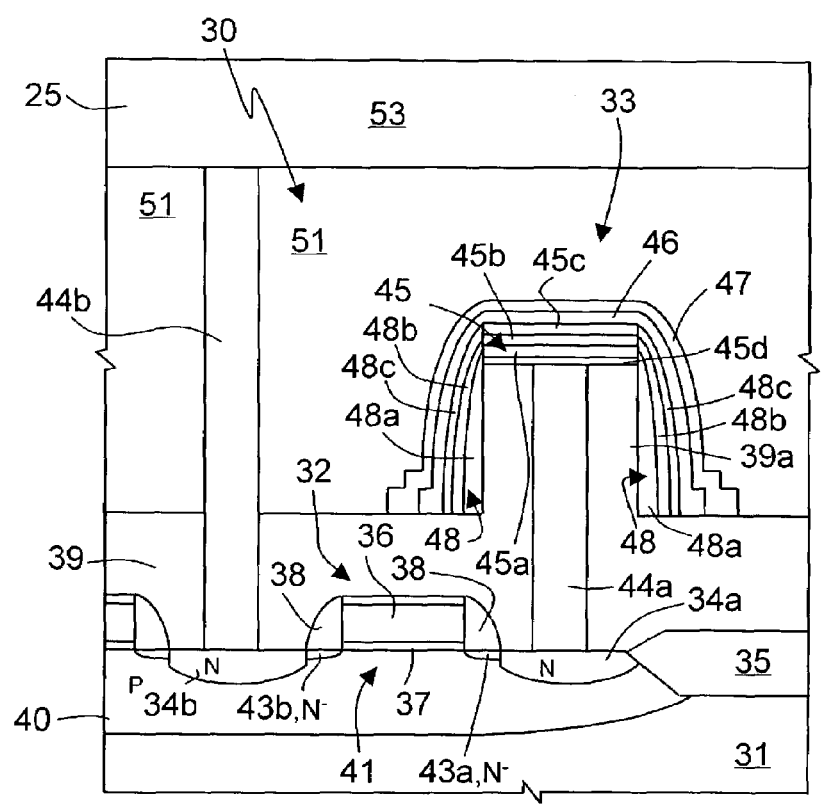
FIG. 5 shows a cross-section of one portion of an array of ferroelectric cells according to an embodiment of the invention.

FIG. 5 shows the structure of a memory cell 30 comprising a MOS transistor 32 and a ferroelectric capacitor 33, connected in series according to an embodiment of the invention. The memory cell 30 comprises a substrate 31 of a first conductivity type, for example P, which houses a well 40 with the same conductivity type, i.e., P in the example considered.

MOS transistor 32 comprises a source region 34a and a drain region 34b, of a second conductivity type, namely N, which are formed in the well 40. A thick oxide (field oxide) region 35 is formed on the substrate 31 and defines, in the semiconductor substrate 31, a conduction area (active area), accommodating the well 40 and overlaid by other regions of the MOS transistor 32, including a gate oxide layer 37 and a control electrode 36 (gate region). The control electrode 36 is formed by a double polysilicon and suicide layer and overlies a channel region 41 formed in the well 40 between a source extension region 43a and a drain extension region 43b, which are respectively contiguous to the source region 34a and to the drain region 34b.

In the illustrated embodiment, oxide spacers 38 extend alongside the control electrode 36 on top of the source and drain extension regions 43a, 43b.

The source region 34a and the drain region 34b are connected, via respective contacts 44a, 44b, to the ferroelectric capacitor 33 and to a metal line 53, respectively.

The control gate 36 may possibly be coated with further layers of conductive materials, such as titanium silicide or tungsten silicide.

A first insulating layer 39, for example of oxide doped with boron and phosphorous (BPSG), covers the substrate 31. Openings are formed in the insulating layer 39, over the source region 34a and drain region 34b, and accommodate contacts 44a, 44b. The contacts 44a and 44b comprise, in a known way, not shown in detail, a titanium-nitride layer, which coats the side walls and the bottoms of the openings of the insulating layer 39, and a conductive material, for example tungsten or polysilicon, which fills the space enclosed by the titanium-nitride layer.

The first insulating layer 39 is typically not planar, but has a projecting portion 39a, arranged at a higher level than the remaining part of the insulating layer 39. The capacitor 33 is formed on top and at the sides of the projecting portion 39a, and comprises a bottom electrode 45, a dielectric region 46 of ferroelectric or paraelectric material, and a top electrode 47.

In detail, the bottom electrode 45 is formed by a stack of layers comprising an adhesion layer 45d, preferably of TiN, at least one barrier layer 45a, preferably of iridium (Ir), a conductive oxide layer 45b, preferably of iridium oxide ($IrO_2$), and a metal layer 45c, preferably of platinum (Pt). The adhesion layer 45d, barrier layer 45a, conductive oxide layer 45b, and metal layer 45c all have substantially the same width, substantially equal to that of the projecting portion 39a.

The bottom electrode 45, in addition to forming the bottom plate of the capacitor 33, also operates as a protection barrier for tungsten or polysilicon deposited inside the contact 44a. In fact, if no protection were provided, the material of the contact (either W or poly-Si) would typically undergo oxidation during crystallization of the ferroelectric material (this process is typically carried out in an oxidizing environment, and hence the reaction $4W+5O_2 \rightarrow 2W_2O_5$ could take place, which would insulate the contact 44a from the bottom electrode, besides damaging it from the mechanical standpoint).

An Ir/$IrO_2$ double layer (formed by the barrier layer 45a and by the conductive oxide layer 45b of the bottom electrode 45) provides, instead, an efficient protection barrier, preventing the oxygen, by diffusing through it, from reaching the contact.

A protection spacer 48 (two portions of which may be seen in FIG. 5) is formed on the four vertical sides of the projecting portion 39a and of the bottom electrode 45. The protection spacer 48 is preferably formed by a first spacer layer 48a of iridium and a second spacer layer 48b of iridium oxide, arranged on top of one another.

According to one aspect of the invention, the protection spacer 48 has the function of protecting from oxidation the adhesion layer 45d and the tungsten or the polysilicon deposited inside the contact 44a. In fact, during manufacturing, the oxygen tends to diffuse along the grain edges of the TiN adhesion layer 45d (causing it to lose its electrical conductivity), and could reach as far as tungsten or polysilicon of the contact 44a, oxidizing the latter. In addition, the protection spacer 48 forms a projection of the bottom electrode 45, as will be described hereinafter.

To this aim, a thin platinum (Pt) layer 48c is arranged on top of the first and second spacer layers 48a, 48b.

The dielectric region 46 is formed by a strip of ferroelectric or paraelectric material (for example, SBT, PZT, BLT or BST) which extends in a direction perpendicular to the cross-section of FIG. 5, over the bottom electrode 45 and over the protection spacer 48.

The top electrode 47 is formed by a strip of conductive material, preferably platinum, which extends over the dielectric region 46, and thus perpendicular to the sheet plane.

A second insulating layer 51, for example of BPSG, coats the capacitor 33 and the first insulating layer 39 and has a planar top surface. The second insulating layer 51 has an opening, accommodating the top portion of the drain contact 44b, which terminates substantially flush with the top surface of the second insulating layer 51.

Figure 1:
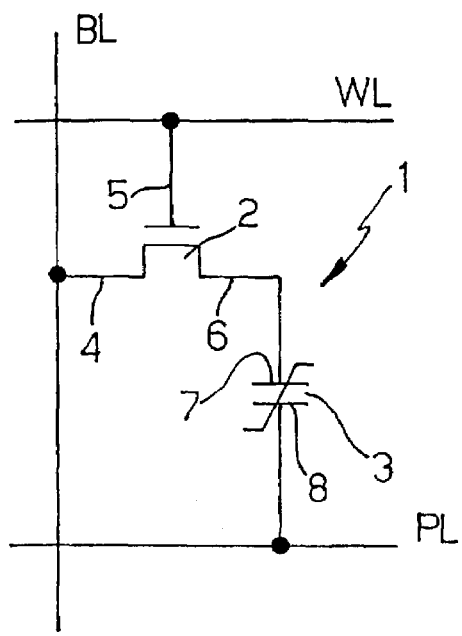
FIG. 1 shows the equivalent circuit of a conventional ferroelectric cell.
Figure 2:
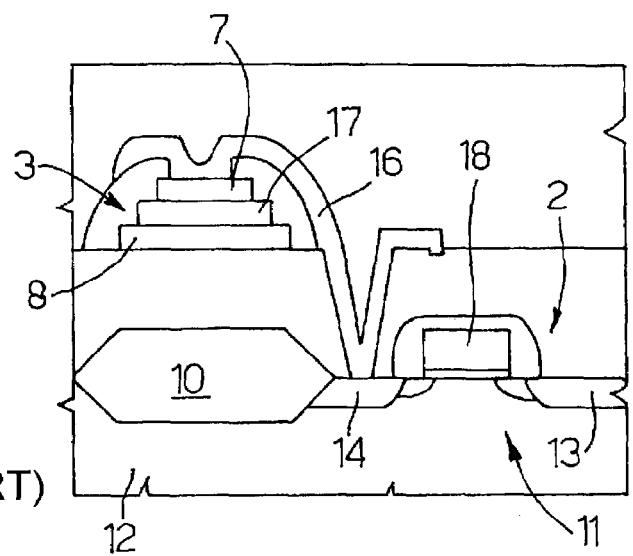
FIG. 2 shows a cross-section of a first type of conventional ferroelectric cell.
Figure 3:
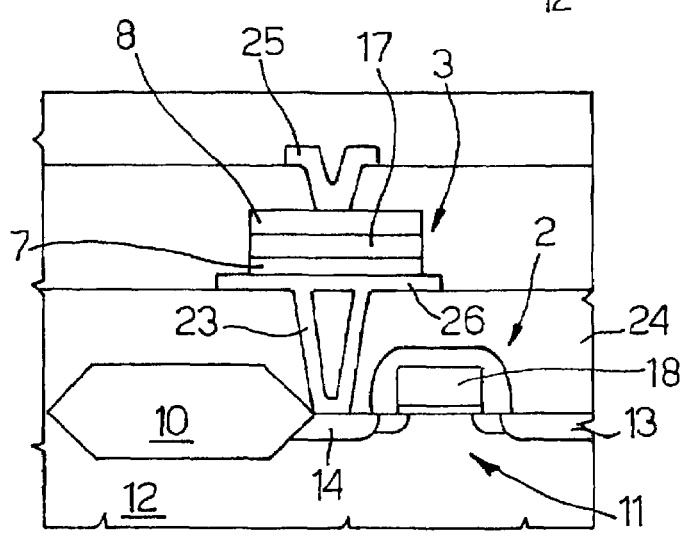
FIG. 3 shows a cross-section of a second type of conventional ferroelectric cell.
Figure 4:
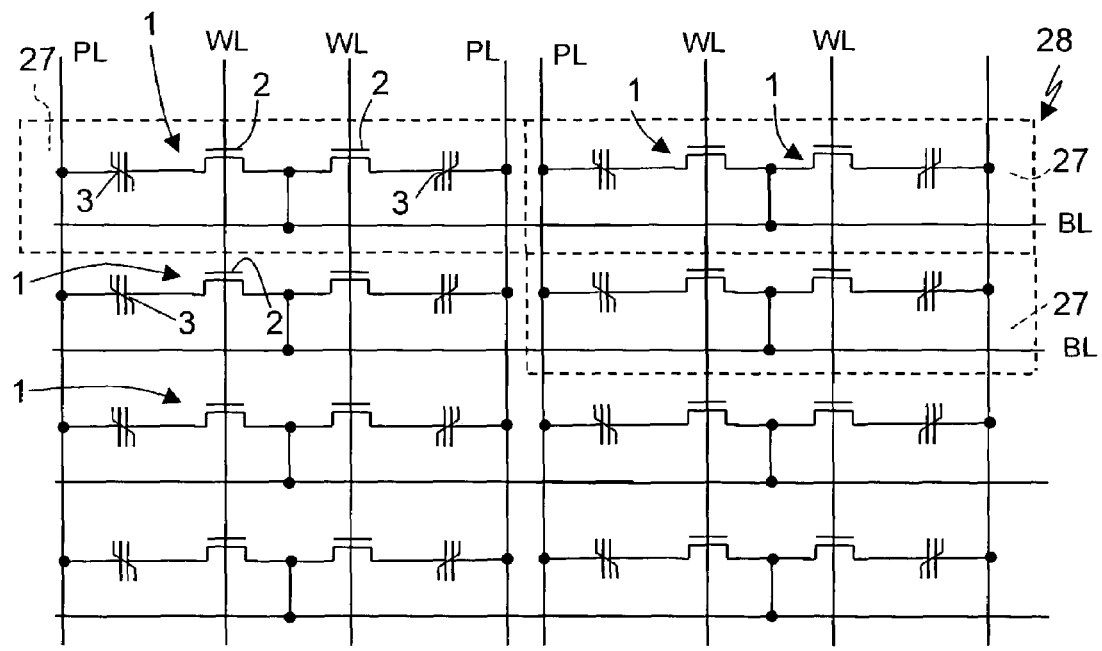
FIG. 4 shows the known architecture of an array of memory cells.

A metal line 53 extends on top of the second insulating layer 51 and defines a bit line (FIG. 1), and a third insulating layer (not shown) extends on top of the latter and houses further electrical connection lines, contacts, pads, etc., in a per se known manner.

The process for manufacturing the cell 30 of FIG. 5 is described hereinafter according to an embodiment of the invention. After forming the transistor 32, a first insulating layer 39 is deposited, and uniformly coats the underlying structure. After forming the openings in the first insulating layer 39, the first contact 44a and second contact 44b, in a per se known manner, the stack of layers constituting the bottom electrode 45 of the ferroelectric capacitor 33 is deposited.

The stack thus obtained (TiN/Ir/IrO$_2$/Pt) is defined using a single mask (referred to as "bottom electrode mask") to form the bottom electrode, typically having a square or rectangular shape. Now, it is possible to use a hard mask which ensures greater resistance to chemical etching of the bottom electrode 45 as compared to the resist mask.

According to an aspect of the invention, etching of the bottom electrode 45 proceeds further with an oxide etch which enables partial removal of the first insulating layer 39. Thereby, the projecting portion 39a is formed, which is self aligned to the bottom electrode 45; namely, the vertical walls of the bottom electrode 45 are aligned to the vertical walls of the projecting portion 39a.

Next, the following operations are carried out in sequence:

1) deposition of Ir/IrO$_2$/Pt (the thickness varies according to the size of the protection spacer 48 that is to be made), followed by a blanket etch with no mask, so as to form the protection spacer 48 and at the same time laterally seal the bottom electrode 45 from the diffusion of the oxygen, as explained previously;
2) deposition of a layer of ferroelectric material (SBT, PZT, or BLT) or paraelectric material (BST or the like);
3) annealing in O$_2$ for causing transition of the ferroelectric or paraelectric material to the desired crystallographic orientation, and thus to the ferroelectric phase;
4) masking and etching of the layer of ferroelectric or paraelectric material;
5) deposition of platinum or of another metal designed to form the top electrode 47; and
6) masking and etching of the metal just deposited for the definition of the top electrode 47.

Then the following steps are carried out: deposition of the second insulating layer 51, planarization of the structure, opening of vias on top of the bottom portion of the contact 44b, and, wherever necessary, filling of the vias thus obtained, with formation, i.e., of the top portion of the contact 44b, and, finally, deposition and definition of the metal lines, according to known processes.

The structure according to the above-described embodiment of the present invention affords various advantages, the major advantage being that a considerable scaling and densification of the ferroelectric memory array is achieved. In fact, the memory cell 30 presents a considerable increase in the capacitance of the ferroelectric capacitor, due to a larger active surface between the bottom electrode 45 and the top electrode 47, increased by the vertical side walls formed by the protection spacer 48 as regards the bottom electrode 45. This enables, in memory arrays that exploit as elementary information element a ferroelectric capacitor or a pair of ferroelectric capacitors, a considerable reduction in the area occupied by each cell, given the same capacitance, redistributing on the side surfaces part of the facing surfaces of the bottom and top electrodes 45, 47. The structure according to the above-described embodiment of the invention is therefore suited to densification, and consequent increase, of the storage capacity per unit area.

Another advantage lies in the excellent protection barrier for the tungsten or polysilicon contact. In particular, the double Ir/IrO$_2$ layer formed by the barrier layer 45a and the conductive oxide layer 45b shields the source contact 44a and the adhesion layer 45d from oxidation. Lateral protection of the adhesion layer 45d is ensured by the spacer layers 48a and 48b.

The manufacturing process is extremely simple. In fact, forming the capacitor with the non-planar structure, as described, requires the addition of a few processing steps which are simple and per se known in the art. The resulting morphology is, nonetheless, sturdy and functional.

Finally, according to the above-described embodiment of the invention, there is a considerable saving in consumption of iridium (which is a very precious metal) as compared to solutions in which the increase in capacitance is obtained by using thick Ir/IrO$_2$ layers.

Finally, it is clear that numerous modifications and variations may be made to the memory cells and fabrication process described and illustrated herein, all falling within the scope of the invention, as defined in the attached claims. For example, the protection spacer 48 (which forms side portions of the bottom electrode 45) may be formed, instead of by a single region surrounding all the vertical sides of the projecting portion 39a, by one or more portions that extend on at least one vertical side of the projecting portion 39a, starting from an edge of the planar portion of the bottom electrode 45.

What is claimed is:

1. A ferroelectric memory cell of a stacked type, comprising a MOS transistor formed in an active region of a substrate of semiconductor material and a ferroelectric capacitor formed on top of said active region, said MOS transistor having a conductive region, and said ferroelectric capacitor having a first electrode and a second electrode separated by a dielectric material region; said conductive region of said MOS transistor being connected to said first electrode of said ferroelectric capacitor through a contact region; said second electrode extending below a boundary between the first electrode and the contact region, wherein said first electrode comprises a horizontal planar portion and at least one first side portion extending transversely to, and in direct electrical contact with, said planar portion.

2. The memory cell according to claim 1, wherein said first electrode comprises at least one second side portion extending transversely with respect to, and in direct electrical contact with, said planar portion, said first and second side portions extending from opposite side ends of said planar portion.

3. The memory cell according to claim 2, wherein said dielectric material region comprises a planar portion, extending on top of and in contact with said horizontal planar portion of said first electrode, and side portions extending on top of and in contact with said side portions of said first electrode.

4. The memory cell according to claim 3, wherein said second electrode comprises a planar portion extending on top of and in contact with said planar portion of said dielectric material region, and side portions extending on top of and in contact with said side portions of said dielectric material region.

5. The memory cell according to claim 2, wherein said horizontal planar portion of said first electrode comprises a barrier layer in electrical contact with said conductive region of said MOS transistor and a conductive layer overlying said barrier layer.

6. The memory cell according to claim 5, wherein said first and second side portions of said first electrode comprise a first and a second spacer layer arranged on top of one another.

7. The memory cell according to claim 5, wherein said first electrode further comprises an adhesion layer arranged between said contact region and said barrier layer.

8. The memory cell according to claim 7, wherein said adhesion layer is of titanium nitride.

9. The memory cell according to claim 5, wherein said first electrode further comprises a metal layer arranged on top of said conductive layer, and said first and second side portions comprise a top layer of metal.

10. The memory cell according to claim 1, wherein said dielectric material region is of a material chosen from the group comprising SBT, PZT, BLT, and BST.

11. The memory cell according to claim 1, wherein said second electrode is of platinum.

12. The memory cell according to claim 1, further comprising an insulating material layer extending on top of said substrate and having a substantially planar top surface and a projecting portion arranged on top of said first conductive region, said planar portion of said first electrode extending on top of and being aligned with said projecting portion, said contact region extending through said insulating material layer and said projecting portion.

13. A ferroelectric memory cell of a stacked type, comprising a MOS transistor formed in an active region of a substrate of semiconductor material and a ferroelectric capacitor formed on top of said active region, said MOS transistor having a conductive region, and said ferroelectric capacitor having a first electrode and a second electrode separated by a dielectric material region; said conductive region of said MOS transistor being connected to said first electrode of said ferroelectric capacitor through a contact region, wherein in said ferroelectric capacitor has a non-planar structure, the first electrode comprises a horizontal planar portion and at least one first side portion extending transversely to, and in direct electrical contact with, said planar portion, said first electrode comprises at least one second side portion extending transversely with respect to, and in direct electrical contact with, said planar portion, said first and second side portions extending from opposite side ends of said planar portion, said horizontal planar portion of said first electrode comprises a barrier layer in electrical contact with said conductive region of said MOS transistor and a conductive layer overlying said barrier layer, said first and second side portions of said first electrode comprise a first and a second spacer layer arranged on top of one another, and said barrier layer and said first spacer layer are of iridium.

14. A ferroelectric memory cell of a stacked type, comprising a MOS transistor formed in an active region of a substrate of semiconductor material and a ferroelectric capacitor formed on top of said active region, said MOS transistor having a conductive region, and said ferroelectric capacitor having a first electrode and a second electrode separated by a dielectric material region; said conductive region of said MOS transistor being connected to said first electrode of said ferroelectric capacitor through a contact region, wherein in said ferroelectric capacitor has a non-planar structure, the first electrode comprises a horizontal planar portion and at least one first side portion extending transversely to, and in direct electrical contact with, said planar portion, said first electrode comprises at least one second side portion extending transversely with respect to, and in direct electrical contact with, said planar portion, said first and second side portions extending from opposite side ends of said planar portion, said horizontal planar portion of said first electrode comprises a barrier layer in electrical contact with said conductive region of said MOS transistor and a conductive layer overlying said barrier layer, said first and second side portions of said first electrode comprise a first and a second spacer layer arranged on top of one another, and said conductive layer of said first electrode and said second spacer layer are of iridium oxide.

15. A ferroelectric memory cell of a stacked type, comprising a MOS transistor formed in an active region of a substrate of semiconductor material and a ferroelectric capacitor formed on top of said active region, said MOS transistor having a conductive region, and said ferroelectric capacitor having a first electrode and a second electrode separated by a dielectric material region; said conductive region of said MOS transistor being connected to said first electrode of said ferroelectric capacitor through a contact region, wherein in said ferroelectric capacitor has a non-planar structure, the first electrode comprises a horizontal planar portion and at least one first side portion extending transversely to, and in direct electrical contact with, said planar portion, said first electrode comprises at least one second side portion extending transversely with respect to, and in direct electrical contact with, said planar portion, said first and second side portions extending from opposite side ends of said planar portion, said horizontal planar portion of said first electrode comprises a barrier layer in electrical contact with said conductive region of said MOS transistor and a conductive layer overlying said barrier layer, said first electrode further comprises a metal layer arranged on top of said conductive layer, and said first and second side portions comprise a top layer of metal, and said metal layer and said top layer are of platinum.

16. A process for manufacturing a memory cell of a stacked type, comprising the steps of:
  forming a MOS transistor having a conductive region in an active region of a substrate of semiconductor material;
  forming, on top of said active region, a ferroelectric capacitor having first and second electrodes separated by a dielectric material region; and
  forming a contact region having a first end coupled to conductive region of said MOS transistor and having a second end in direct contact with a first portion of said first electrode of said ferroelectric capacitor such that the second electrode and a second portion of the first electrode extend below the first portion of the first electrode.

17. The process according to claim 16, wherein said dielectric material region is of a material chosen from the group comprising SBT, PZT, BLT, and BST.

18. The process according to claim 16, wherein said second electrode is of platinum.

19. A ferroelectric capacitor, comprising:
a first electrode disposed on a plateau surface and on at least one side-wall surface of a nonconductive pillar;
a dielectric disposed on the first electrode over the plateau surface and over the at least one side-wall surface; and
a second electrode disposed on the dielectric over the plateau surface and over the at least one side-wall surface.

20. The ferroelectric capacitor of claim 19, further comprising a conductive contact disposed within the pillar and in contact with the first electrode.

21. The ferroelectric capacitor of claim 19 wherein the first electrode comprises multiple conductive layers.

22. A ferroelectric capacitor, comprising:
a first electrode disposed on a surface and at least one side wall of a nonconductive pillar;
a dielectric disposed on the first electrode adjacent to the surface and the at least one side wall;
a second electrode disposed on the dielectric adjacent to the surface and the at least one side wall; and
wherein the first electrode comprises,
    a first portion disposed on the surface of the pillar and comprising a first material, and
    a second portion disposed on the at least one sidewall of the pillar and comprising a second material that is different than the first material.

23. A ferroelectric capacitor, comprising:
a first electrode disposed on a surface and at least one side wall of a nonconductive pillar;
a dielectric disposed on the first electrode adjacent to the surface and the at least one side wall;
a second electrode disposed on the dielectric adjacent to the surface and the at least one side wall; and
wherein the first electrode comprises,
    a first portion disposed on the surface of the pillar and comprising a first number of layers, and
    a second portion disposed on the at least one side wall of the pillar and comprising a second number of layers that is different than the first number.

24. A ferroelectric capacitor, comprising:
a first electrode disposed on a surface and at least one side wall of a nonconductive pillar;
a dielectric disposed on the first electrode adjacent to the surface and the at least one side wall;
a second electrode disposed on the dielectric adjacent to the surface and the at least one side wall; and
wherein the first electrode comprises,
    a first portion disposed on the surface of the pillar and comprising a first number of materials, and
    a second portion disposed on the at least one side wall of the pillar and comprising a second number of materials that is different than the first number.

25. A memory cell, comprising:
a transistor;
an insulator disposed on the transistor and including a first surface and including a projection having at least one side wall and having a second surface that is farther from the transistor than the first surface; and
a ferroelectric capacitor having a first electrode that is electrically coupled to the transistor and that is contiguous with the second surface and the side wall and that is disposed on the side wall.

26. The memory cell of claim 25, further comprising:
a dielectric of the ferroelectric capacitor disposed on and contiguous with the first electrode and disposed over the at least one side wall of the projection; and
a second electrode of the ferroelectric capacitor disposed on and contiguous with the dielectric and disposed over the at least one side wall.

27. The memory cell of claim 25, further comprising a contact disposed within the projection and electrically coupling the transistor to the first electrode of the ferroelectric capacitor.

28. The memory cell of claim 25 wherein the first electrode comprises multiple conductive layers.

29. A memory cell, comprising:
a transistor;
an insulator disposed on the transistor and including a first surface and including a projection having at least one side wall and having a second surface that is farther from the transistor than the first surface;
a ferroelectric capacitor disposed on the second surface and the side wall and having a first electrode that is electrically coupled to the transistor, is contiguous with the second surface of the projection, and has an edge; and
an electrically conductive spacer disposed on the side wall and electrically coupled to the edge of the first electrode.

30. A method for forming a ferroelectric capacitor, the method comprising:
forming a first electrode on a plateau surface and on at least one side-wall surface of a pillar;
forming a dielectric on the first electrode over the plateau surface and over the at least one side-wall surface; and
forming a second electrode on the dielectric over the plateau surface and over the at least one side-wall surface.

31. A memory cell, comprising:
a transistor;
an insulator disposed on the transistor and including a first surface and including a projection having at least one side-wall surface and having a second surface that is farther from the transistor than the first surface; and
a ferroelectric capacitor having a bottom electrode that is electrically coupled to the transistor and that is disposed on the second surface and on the side-wall surface.

32. The memory cell of claim 31 wherein the bottom electrode is contiguous with the second surface and with the side-wall surface.

33. A memory cell, comprising:
a transistor;
an insulator disposed on the transistor and including a first surface and including a projection having at least one side wall and having a second surface that is farther from the transistor than the first surface;
a ferroelectric capacitor having a first electrode that is electrically coupled to the transistor, is disposed on the second surface of the projection, and has an edge; and
an electrically conductive spacer disposed on the side wall and electrically coupled to the edge of the first electrode.

34. The memory cell of claim 33, wherein:
the first electrode is contiguous with the second surface of the projection; and
the spacer is contiguous with the side wall and with the edge of the first electrode.

35. A memory cell, comprising:
a transistor;
an insulator disposed on the transistor and including a first surface and including a projection having a second surface that is farther from the transistor than the first surface;
a contact disposed within the projection and having a first end electrically coupled to the transistor and having a second end; and
a ferroelectric capacitor having a bottom electrode that is disposed on the second surface, that includes a first region that is in direct contact with the second end of the contact, and that includes a second region that extends below the first region.

* * * * *

UNITED STATES PATENT AND TRADEMARK OFFICE
CERTIFICATE OF CORRECTION

| | | |
|---|---|---|
| PATENT NO. | : 7,049,646 B2 | Page 1 of 4 |
| APPLICATION NO. | : 10/327704 | |
| DATED | : May 23, 2006 | |
| INVENTOR(S) | : Raffaele Zambrano and Cesare Artoni | |

It is certified that error appears in the above-identified patent and that said Letters Patent is hereby corrected as shown below:

Please Add Claims 36-49

-- 36. The process according to claim 17 wherein said step of forming a ferroelectric capacitor comprises the steps of:

forming an insulating layer on top of said substrate;

forming said contact region in said insulating layer;

forming an electrode layer on top of said insulating layer;

selectively removing said electrode layer and part of said insulating layer to form a planar portion of said first electrode and a projecting portion in said insulating layer, said projecting portion having side surfaces extending transversely to said planar portion of said first electrode;

forming side portions of said first electrode which are in direct electrical contact with said planar portion of said first electrode and are contiguous to said side surfaces of said projecting portion;

forming said dielectric material region on top of said planar portion and said side portions of said first electrode; and forming said second electrode on top of and in contact with said dielectric material region.

37. The process according to claim 36 wherein said step of forming an electrode layer comprises the steps of forming a barrier layer on top of said insulating layer and forming a conductive layer on top of said barrier layer.

38. The process according to claim 37 wherein said step of forming side

UNITED STATES PATENT AND TRADEMARK OFFICE
CERTIFICATE OF CORRECTION

| | | |
|---|---|---|
| PATENT NO. | : 7,049,646 B2 | |
| APPLICATION NO. | : 10/327704 | |
| DATED | : May 23, 2006 | |
| INVENTOR(S) | : Raffaele Zambrano and Cesare Artoni | |

It is certified that error appears in the above-identified patent and that said Letters Patent is hereby corrected as shown below:

portions of said first electrode comprises forming a first and a second spacer layers arranged on top of one another.

39. The process according to claim 38 wherein said barrier layer and said first spacer layer are of iridium.

40. The process according to claim 38 wherein said conductive layer of said first electrode and said second spacer layer are of iridium oxide.

41. The process according to claim 37 wherein before forming a barrier layer, the step is carried out of forming an adhesion layer on top of and in contact with said insulating layer.

42. The process according to claim 41 wherein said adhesion layer is of titanium nitride.

43. The process according to claim 38 wherein after said step of forming a conductive layer, the step is carried out of forming a metal layer arranged on top of said conductive layer, and in that, after said step of forming a first and a second spacer layers, the step is carried out of forming a top layer of metal material.

44. The process according to claim 42 wherein said metal layer and said top layer are of platinum.

45. The process according to claim 36 wherein said step of forming side portions of said first electrode comprises depositing at least a first and a second spacer layer on top of said first electrode, and blanket etching said first and second spacer layers.

UNITED STATES PATENT AND TRADEMARK OFFICE
CERTIFICATE OF CORRECTION

| | | |
|---|---|---|
| PATENT NO. | : 7,049,646 B2 | |
| APPLICATION NO. | : 10/327704 | |
| DATED | : May 23, 2006 | |
| INVENTOR(S) | : Raffaele Zambrano and Cesare Artoni | |

It is certified that error appears in the above-identified patent and that said Letters Patent is hereby corrected as shown below:

46. The method of claim 30 wherein forming the first electrode comprises:

forming a conductive layer on an insulator; and etching the conductive layer and the insulator to form the pillar from the insulator and a portion of the first electrode from the conductive layer.

47. The method of claim 30 wherein forming the first electrode comprises:

forming a first conductive layer on an insulator;

etching the conductive layer and the insulator to form the pillar from the insulator and a first portion of the first electrode from the conductive layer;

forming a second conductive layer on the pillar; and etching the second conductive layer to form a second portion of the first electrode on the at least one side wall.

48. The method of claim 30 wherein forming the dielectric comprises:

forming a layer of ferroelectric material on the first electrode; and causing the ferroelectric material to attain the desired crystallographic orientation.

UNITED STATES PATENT AND TRADEMARK OFFICE
CERTIFICATE OF CORRECTION

PATENT NO.       : 7,049,646 B2
APPLICATION NO.  : 10/327704
DATED            : May 23, 2006
INVENTOR(S)      : Raffaele Zambrano and Cesare Artoni It is certified that error appears in the above-identified patent and that said Letters Patent is hereby corrected as shown below:

49.      The method of claim 30 wherein forming the dielectric comprises:

forming a layer of paraelectric material on the first electrode; and causing the paraelectric material to attain the desired crystallographic orientation. --

Signed and Sealed this

Third Day of April, 2007

JON W. DUDAS
*Director of the United States Patent and Trademark Office*